United States Patent
Kim et al.

(10) Patent No.: US 7,008,863 B2
(45) Date of Patent: Mar. 7, 2006

(54) METHOD FOR FORMING POLYCRYSTALLINE SILICON FILM

(75) Inventors: Eok Su Kim, Seoul (KR); Ho Nyeon Lee, Kyoungki-do (KR); Myung Kwan Ryu, Kyoungki-do (KR); Jae Chul Park, Seoul (KR); Kyoung Seok Son, Seoul (KR); Jun Ho Lee, Kyoungki-do (KR); Se Yeoul Kwon, Seoul (KR)

(73) Assignee: Boe Hydis Technology Co., Ltd., Kyoungki-do (KR)

( * ) Notice: Subject to any disclaimer, the term of this patent is extended or adjusted under 35 U.S.C. 154(b) by 0 days.

(21) Appl. No.: 10/934,153

(22) Filed: Sep. 3, 2004

(65) Prior Publication Data

US 2005/0142897 A1 Jun. 30, 2005

(30) Foreign Application Priority Data

Dec. 29, 2003 (KR) .................. 10-2003-0098757

(51) Int. Cl.
*H01L 21/36* (2006.01)
*H01L 21/205* (2006.01)

(52) U.S. Cl. .................. 438/479; 438/486; 438/487

(58) Field of Classification Search ................ 438/486; 11/487
See application file for complete search history.

(56) References Cited

U.S. PATENT DOCUMENTS 6,867,151 B1 * 3/2005 Jung .................. 438/778

* cited by examiner

*Primary Examiner*—W. David Coleman
*Assistant Examiner*—Su C. Kim
(74) *Attorney, Agent, or Firm*—Ladas & Parry LLP

(57) ABSTRACT

Disclosed is a method for forming a polycrystalline silicon film by crystallizing an amorphous silicon film. A mask has first to third shot regions having the same length. The first to third shot regions have transmission sections and non-transmission sections, which are alternately aligned. The transmission sections of the first shot region are positioned corresponding to the non-transmission sections of the second shot region, the non-transmission sections of the first shot region are positioned corresponding to the transmission sections of the second shot region, and the transmission sections of the third shot region are aligned corresponding to center portions of the transmission sections of the first and second shot regions. Primary to $n^{th}$ laser irradiation processes are performed with respect to the glass substrate, thereby crystallizing the amorphous silicon film into the polycrystalline silicon film.

8 Claims, 3 Drawing Sheets

METHOD FOR FORMING POLYCRYSTALLINE SILICON FILM

BACKGROUND OF THE INVENTION

1. Field of the Invention

The present invention relates to a method for fabricating a liquid crystal display device, and more particularly to a method for forming a polycrystalline silicon film in order to fabricate a polycrystalline silicon thin film transistor.

2. Description of the Prior Art

A thin film transistor (hereinafter, simply referred to as "TFT") used as a switching device in a liquid crystal display device or an organic light emitting display is a main component for improving performance of such flat panel display devices. Herein, mobility or current leakage, which is a basic factor determining performance of the TFT, varies depending on a state of an active layer providing a route for a charge carrier. That is, such mobility or current leakage may vary depending on a state or a structure of a silicon thin film forming the active layer. In currently available liquid crystal display devices, the active layer of the TFT is made from amorphous silicon (hereinafter, simply referred to as a-Si)

However, an a-Si TFT including a-Si as an active layer has low mobility of about 0.5 $cm^2/Vs$, so problems may occur if all switching devices of the liquid crystal display device are fabricated using an a-Si TFT. That is, a driving device for a peripheral circuit of the liquid crystal display device must be operated with a high speed, but the a-Si TFT cannot satisfy the operational speed required by the peripheral circuit of the liquid crystal display, so a problem may occur if the driving device for the peripheral circuit is fabricated by using the a-Si TFT.

Meanwhile, a poly-Si TFT including polycrystalline silicon (hereinafter, simply referred to as poly-Si) as an active layer has high mobility of about tens of or hundreds of $cm^2/Vs$. Thus, the poly-Si TFT can satisfy the high operational speed required by the peripheral circuit of the liquid crystal display. Therefore, it is possible to achieve a pixel switching device as well as driving parts for the peripheral circuit by forming the poly-Si TFT on a glass substrate. Accordingly, a module process for the peripheral circuit is not required and costs for the driving parts of the peripheral circuit can be saved because the driving parts of the peripheral circuit can be simultaneously formed when forming a pixel region.

In addition, the poly-Si TFT can be fabricated with a small size as compared with the a-Si TFT due to high mobility of the poly-Si TFT. Furthermore, since the driving device of the peripheral circuit and the switching device of the pixel region can be simultaneously formed through an integration process, a micro design rule can be easily achieved so that an a-Si TFT-LCD can provide an image having high resolution.

Moreover, since the poly-Si TFT has a superior current characteristic, the poly-Si TFT is adaptable for a driving device of an organic light emitting display, which is a next-generation flat panel display device. Thus, studies and research regarding the poly-Si TFTs have been actively carried out to fabricate the poly-Si TFTs by forming a poly-Si film on a glass substrate.

In order to form such a poly-Si film on the glass substrate, an a-Si film is deposited on the glass substrate and a heat-treatment process is carried out with respect to the a-Si film, thereby crystallizing the a-Si film. However, in this case, the glass substrate may be deformed if a process temperature exceeds 600° C., thereby lowering reliability and productivity.

Thus, an excimer laser annealing process has been suggested in order to crystallize the a-Si film without causing a terminal damage to the glass substrate. In addition, a sequential lateral solidification (hereinafter, simply referred to as "SLS") method has been suggested.

According to the SLS method, poly-Si is formed by crystallizing a-Si using a pulse layer and a mask having a slit pattern providing a transmission route for a pulse laser beam. In this case, a crystallization status of poly-Si may vary depending on a shape of the mask and a proceeding route of the laser beam.

According to the SLS method, a seed poly-Si film is firstly formed and a next poly-Si film is grown based on the seed poly-Si film through a directional process, a 2-shot process, a 3-shot process, and an n-shot process.

In a first shot of the 3-shot SLS method, poly-Si grains growing from a slit pattern of a first shot, that is, poly-Si grains laterally growing from both sides of a transmission section make contact with each other at a center portion of the transmission section while forming a protrusion so that the growth of the poly-Si grains may stop at the center portion of the transmission section. In addition, in a second shot of the 3-shot SLS method, poly-Si grains are grown based on seed poly-Si grains, which have been grown in the first shot, and the growth of the poly-Si grains may stop when poly-Si grains laterally growing from both sides of the transmission section make contact with each other. In addition, in a third shot of the 3-shot SLS method, poly-Si grains are grown based on seed poly-Si grains, which have been grown in the first and second shots, and the growth of the poly-Si grains may stop when poly-Si grains make contact with each other.

However, according to the 3-shot SLS method, the growth of the poly-Si grains laterally growing from both sides of the transmission section may stop when the poly-Si grains make contact with each, so the poly-Si grains cannot be grown in a maximum size. Accordingly, a size of the poly-Si grains may be limited, so performance of a poly-Si TFT is also limited.

SUMMARY OF THE INVENTION

Accordingly, the present invention has been made to solve the above-mentioned problems occurring in the prior art, and an object of the present invention is to provide a method for forming a poly-Si film, capable of maximizing a size of poly-Si grains while using a 3-shot SLS method.

Another object of the present invention is to provide a method for forming a poly-Si film, capable of improving performance of a TFT by maximizing a size of poly-Si grains while using a 3-shot SLS method.

In order to accomplish the object, there is provided a method for forming a polycrystalline silicon film by crystallizing an amorphous silicon film, which is formed on a glass substrate by interposing a buffer layer therebetween, by irradiating a laser beam onto the amorphous silicon film using a predetermined mask, the method comprising the steps of: i) dividing an area of the predetermined mask into first to third shot regions having lengths identical to each other in such a manner that the first to third shot regions have transmission sections and non-transmission sections, which are alternately aligned, in which the transmission sections of the first shot region are positioned corresponding to the non-transmission sections of the second shot region and the non-transmission sections of the first shot region are positioned corresponding to the transmission sections of the second shot region in such a manner that edges of the transmission sections of the first shot regions are overlapped with edges of the transmission sections of the second shot regions, and the transmission sections of the third shot region are aligned corresponding to center portions of the transmission sections of the first and second shot regions; and ii) performing primary to $n^{th}$ laser irradiation processes with respect to the glass substrate by using the mask having a mask pattern while moving the glass substrate in a predetermined direction by a predetermined distance, thereby crystallizing the amorphous silicon film.

According to the preferred embodiment of the present invention, spontaneous nucleation is created in the transmission sections of the first and second shot regions when a laser beam is irradiated onto the transmission sections of the first and second shot regions, and the amorphous silicon film is crystallized into the poly crystalline silicon film by means of a laser beam irradiated onto the amorphous silicon film through transmission sections of the third shot region. A thickness of the transmission sections of the third shot region is smaller than a thickness of the transmission sections of the first and second shot regions.

According to the preferred embodiment of the present invention, the laser irradiation processes are carried out with energy sufficient for completely melting the amorphous silicon film or the polycrystalline silicon film by using a pulse duration extender in such a manner that pulse duration time is increased.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, preferred embodiments of the present invention will be described with reference to accompanying drawings.

According to a technical principle of the present invention, a-Si is crystallized through a 3-shot SLS method in order to form poly-Si. At this time, a shape of a mask pattern is varied in such a manner that grains formed in a poly-Si film have a size significantly larger than a size of grains of a poly-Si film formed through a conventional method.

That is, according to the SLS method, grains growing from both sides of the poly-Si film make contact with each other at a center of the poly-Si film so that the growth of the grains may stop. At this time, a size of the poly-Si grain relates to a thickness of a slit pattern providing a path or a transmission route of a layer beam for melting a-Si. Conventionally, although it will not be described in detail, a thickness of the slit pattern providing the transmission route for the layer beam is thin, so that a growing length of grains laterally growing from both sides of the slit pattern becomes reduced, thereby reducing a growing size of grains. Thus, a size of grains formed in the poly-Si film may be limited.

Therefore, when performing the 3-shot process of the present invention, a mask pattern of a mask must be divided into three regions in such a manner that a first shot region has transmission and non-transmission sections, and a second shot region has transmission sections corresponding to the non-transmission sections of the first shot region and non-transmission sections corresponding to the transmission sections of the first shot region. In addition, a slit pattern forming the transmission sections has a thickness larger than a thickness of a conventional slit pattern such that spontaneous nucleation may be generated at a center of the slit pattern. In addition, a third shot region is formed at a predetermined position thereof with transmission sections in such a manner that predetermined portions of the first and second shot regions, in which spontaneous nucleation has been generated, are melted again and grains are laterally grown in the predetermined portions.

Thus, the sizes of the grains grown by means of first and second shot processes increase as compared with the sizes of grains grown by means of the conventional method. As a result, the method of the present invention can form a poly-Si film having large-sized grains, thereby improving performance of a poly-Si TFT.

Hereinafter, the method for forming the poly-Si film by using the SLS method according to the present invention will be described in detail with reference to FIGS. 1 to 3.

Figure 1:
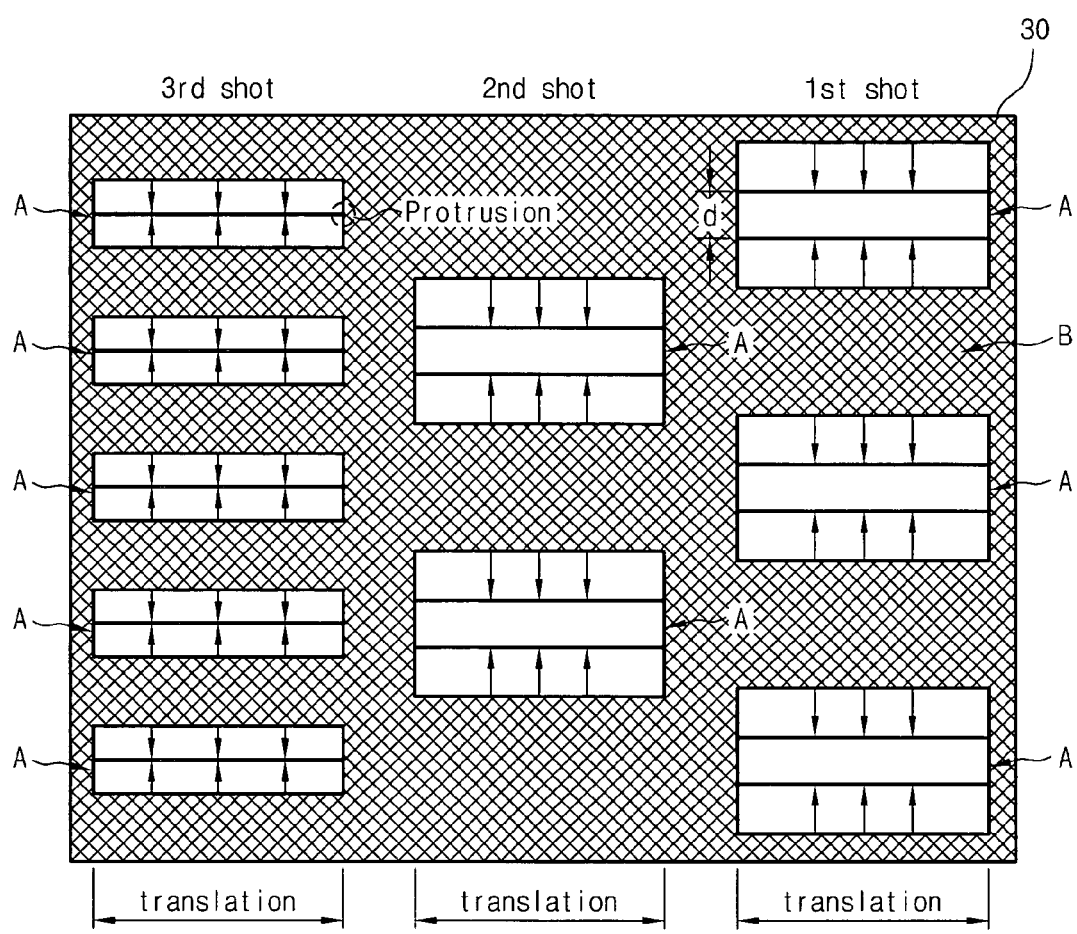
FIG. 1 is a view showing a mask pattern used in a method for forming a poly-Si film according to one embodiment of the present invention.
Figure 2:
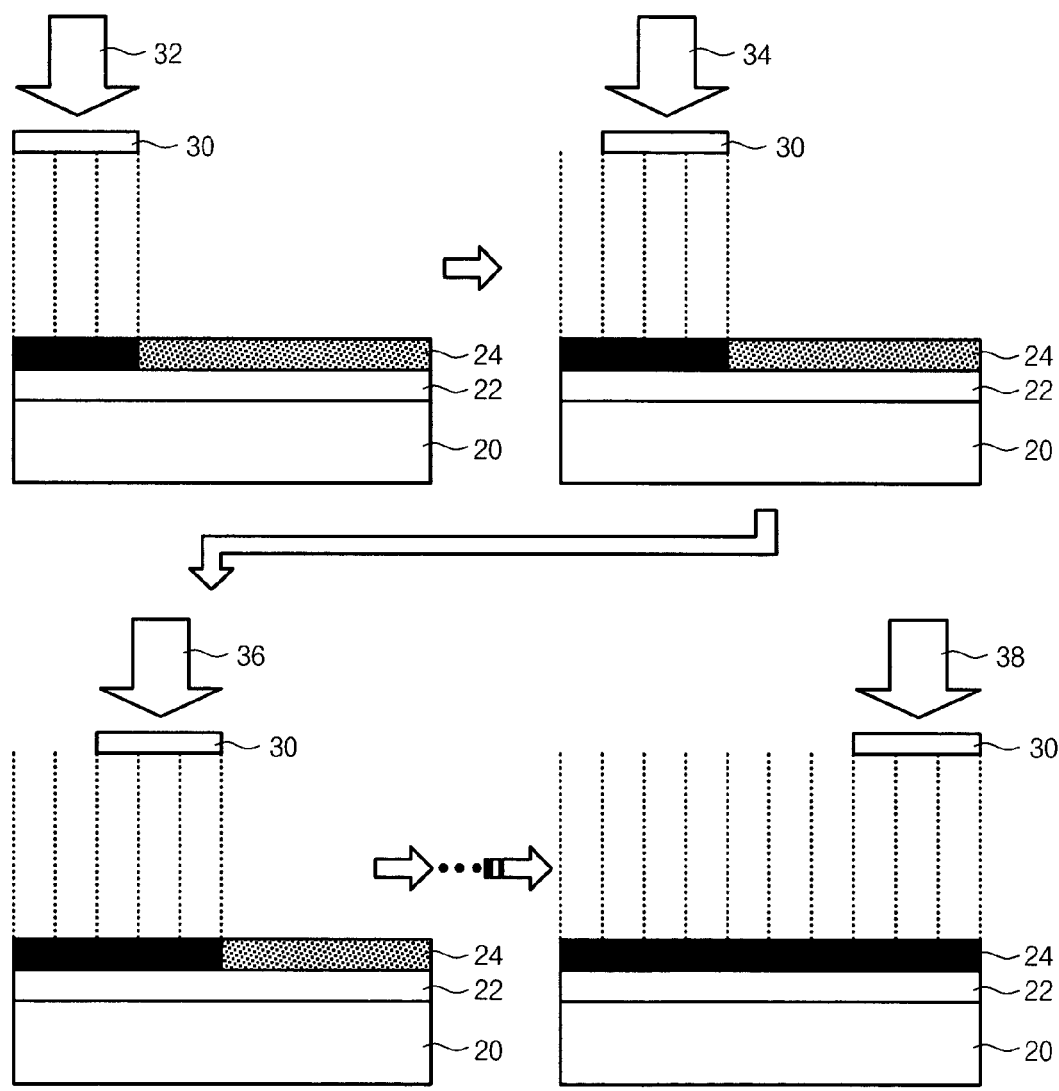
FIG. 2 is a view for explaining a method for forming a poly-Si film according to one embodiment of the present invention.
Figure 3:
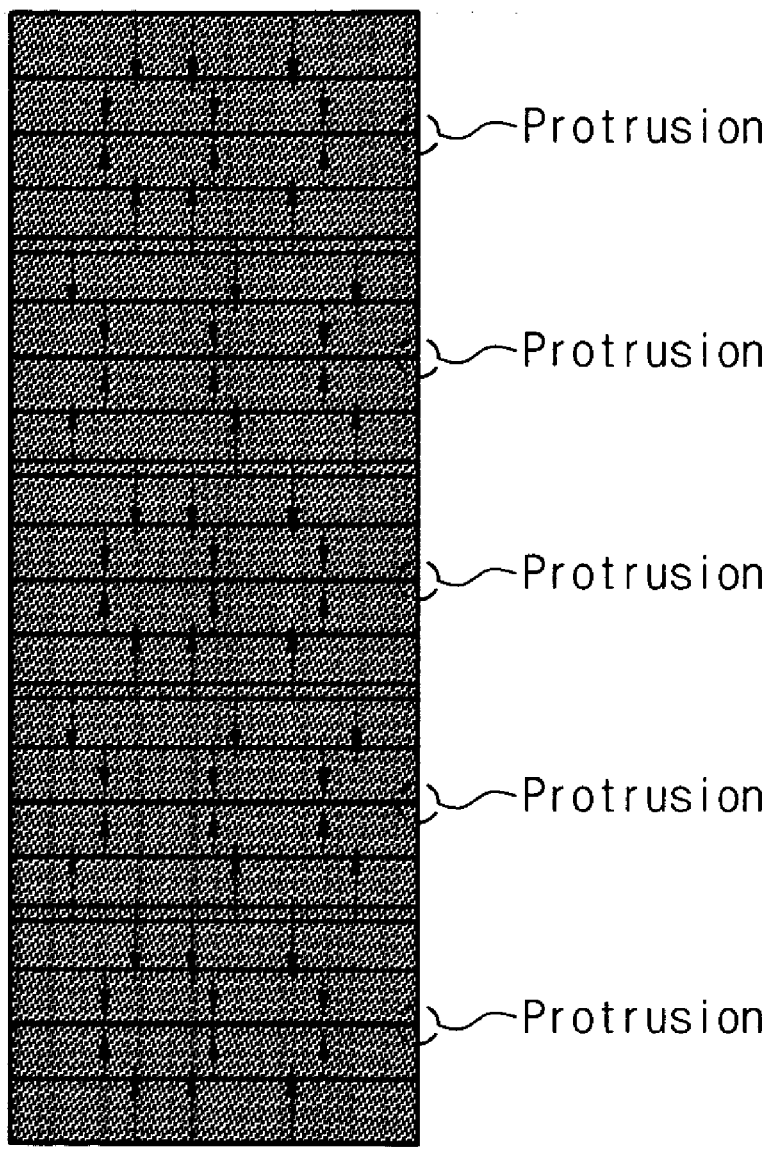
FIG. 3 is a view showing a microstructure of a poly-Si film formed through a method according to one embodiment of the present invention.

Herein, FIG. 1 is a view showing a mask pattern used in a method for forming the poly-Si film according to one embodiment of the present invention, FIG. 2 is a view for explaining the method for forming the poly-Si film according to one embodiment of the present invention, and FIG. 3 is a view showing a microstructure of the poly-Si film formed through the method according to one embodiment of the present invention.

Referring to FIG. 1, a mask 30 used in the method for forming the poly-Si film according to one embodiment of the present invention has three regions having predetermined mask patterns, that is, the mask 30 has first to third shot regions. The first to third shot regions have transmission sections A formed by the slit pattern, and non-transmission sections B in which the slit pattern is not formed, respectively. The transmission sections A and non-transmission sections B of first to third shot regions are alternately aligned in a longitudinal direction of the mask 30.

In detail, the first shot region has transmission sections A and non-transmission sections B, which are alternately aligned. At this time, the transmission sections A must have a sufficient thickness d such that spontaneous nucleation can be generated at center portions thereof. Meanwhile, regions in which the spontaneous nucleation is generated (hereinafter, referred to as "nucleation region") must be designed to have a sufficient thickness d such that the nucleation regions can be completely melted through the third shot process and can be formed with poly-Si which has been laterally grown.

Similarly to the first shot region, the second shot region includes transmission sections A and non-transmission sections B, which are alternately aligned. The transmission sections A of the second shot region are positioned corresponding to the non-transmission sections B of the first shot region, and non-transmission sections A of the second shot region are positioned corresponding to the transmission sections B of the first shot region. In addition, an edge portion of each transmission section A of the second shot region is overlapped with an edge portion of each transmission section A of the first shot region in order to allow grains to continuously grow. In the same manner as the transmission sections A of the first shot region, the transmission sections A of the second shot region must have a sufficient thickness d such that spontaneous nucleation can be generated at center portions thereof.

Similarly to the first and second shot regions, the third shot region includes transmission sections A and non-transmission sections B, which are alternately aligned. However, the transmission sections A of the third shot region are aligned corresponding to the nucleation areas of the first and second shot regions in such a manner that the nucleation areas of the first and second shot regions become a poly-Si area through a lateral growth of the grains. Preferably, a thickness of the transmission sections A of the third shot region is slightly larger than a thickness of the nucleation areas.

A length of each shot region corresponds to a translation distance of the mask pattern when performing the SLS process.

Hereinafter, the method for forming the poly-Si film by using the mask 30 according to the present invention will be described with reference to FIG. 2.

Referring to FIG. 2, a buffer layer 22 including an oxide layer or a nitride layer having silicon, such as SiOx, SiOxNy, or SiNx, a metal layer containing Al, Cu, Ag, Ti or W, a metal nitride layer or a metal oxide layer is formed on a glass substrate 20. Then, an a-Si film 24 is deposited on the buffer layer 22.

After that, the mask 30 having a mask pattern as shown in FIG. 1 is aligned above the a-Si film 24. In this state, a primary laser irradiation process 32 is carried out with respect to the a-Si film 24 by using a pulse laser beam having energy sufficient for completely melting corresponding a-Si areas of the a-Si film 24.

At this time, the laser beam only passes through the transmission sections A of the first shot region, and the a-Si areas of the a-Si film 24, onto which the laser beam is irradiated, are completely melted. In addition, a temperature of the melted a-Si areas becomes lowered as time goes by, so that solidification of a-Si into poly-Si and lateral growth of grains may occur from peripheral portions of the a-SI film 24 on to which the laser beam has been irradiated. In particular, the grains growing from both sides of the melted areas make contact with nucleation areas created at a center portion of each melted area so that the lateral growth of the grains may stop. Thus, according to the present invention, the grains may laterally grow until spontaneous nucleation is created at center portions of the melted areas, so that it is possible to obtain poly-Si having large-sized grains.

Then, the glass substrate 20 is moved by a predetermined distance corresponding to a translation distance of the mask pattern and a secondary laser irradiation process 34 is carried out. In this case, the laser beam is irradiated onto predetermined portions of the a-Si film which are not crystallized through the primary irradiation process, such as peripheral portions of crystal areas crystallized through the primary irradiation process. In the same manner as mentioned above, the temperature of a-Si areas, which have been completely melted through the secondary irradiation process 34, becomes lowered as time goes by, so that solidification of a-Si into poly-Si and lateral growth of grains may occur from peripheral portions of the melted a-Si areas. At this time, since the grains are laterally grown based on seed poly-Si, which has been formed through the primary laser irradiation process, the grains can be continuously grown. In addition, as mentioned above, the grains growing from both sides of the melted areas make contact with nucleation areas created at a center portion of each melted area so that the lateral growth of the grains may stop. Thus, according to the present invention, the grains may laterally grow until spontaneous nucleation is created at center portions of the melted areas, so that it is possible to obtain poly-Si having large-sized grains.

After the primary and secondary laser irradiation processes have been completed, poly-Si having large-sized grains, which are grown from both sides of he melted areas due to the first and second regions of the mask pattern, may exist together with poly-Si having small-sized grains created due to nucleation generated at the center portions of the melted areas.

Meanwhile, a poly-Si area having small-sized grains may exert a bad influence on the characteristic of the poly-Si film. Accordingly, the poly-Si area having small-sized grains is removed by performing a third laser irradiation process 36.

That is, the glass substrate 20 is again moved by a predetermined distance corresponding to a translation distance of the mask pattern and the third laser irradiation process 36 is carried out using a pulse laser. At this time, the third laser irradiation process 36 is carried out with respect to the nucleation areas created through the primary and secondary laser irradiation processes 32 and 34, that is, the third laser irradiation process 36 is carried out with respect to the poly-Si areas having small-sized grains. Therefore, the third laser irradiation process 36 must be carried out with energy sufficient for completely melting the poly-Si areas having small-sized grains.

After the third laser irradiation process has been completed, the poly-Si areas having large-sized grains may be completely melted and the temperature of the melted areas becomes reduced as time goes by, so that solidification of a-Si into poly-Si and lateral growth of the grains may occur from peripheral portions of the melted areas. At this time, since the grains are laterally grown based on seed poly-Si, which has been formed through the primary and secondary laser irradiation processes, the grains can be continuously grown. In addition, grains laterally growing from both sides of the transmission sections make contact with each other at the center portions of the melted areas while forming a protrusion, so the lateral growth of the grains may stop.

Herein, identical to the conventional method, growth of poly-Si formed through the third laser irradiation process may stop when grains laterally growing from both sides of the transmission sections make contact with each other at the center portions of the melted areas. Thus, the sizes of the grains may not be significantly enlarged through the third laser irradiation process. However, since poly-Si having large-sized grains has been formed through the primary and secondary laser irradiation processes and a size of the melted areas is slightly enlarged through the third laser irradiation process even though the third laser irradiation process has been performed with respect to the nucleation areas, poly-Si having large-sized grains may be obtained in areas in which the third laser irradiation process has been carried out.

After that, the above-mentioned procedure has been repeatedly and continuously carried out. That is, primary to $n^{th}$ laser irradiation processes 32 to 38 are continuously carried out using the pulse laser while moving the glass substrate 20 by a predetermined distance corresponding to the translation distance of the mask pattern, thereby crystallizing the whole area of the a-Si film. As a result, it is possible to form a poly-Si film 26 of a microstructure having large-sized grains as shown in FIG. 3.

Meanwhile, according to another embodiment of the present invention, a plastic substrate can be used instead of the glass substrate. In addition, the laser irradiation processes are preferably carried out by using a pulse duration extender such that pulse duration time can be increased.

When performing the laser irradiation processes, the glass substrate or the plastic substrate can move in front and rear directions thereof.

In addition, the method of the present invention as described above can be used not only for crystallizing the a-Si film, but also for crystallizing a-Ge, a-SixGey, a-Ga, a-GaNx or a-GaxAsy. Moreover, the method of the present invention can be used for crystallizing multi-crystalline layers.

As described above, according to the present invention, a-Si is crystallized into poly-Si through an SLS method by varying a shape of a mask pattern in such a manner that the grains may laterally grow until spontaneous nucleation is created at center portions of transmission sections. Thus, it is possible to form poly-Si having large-sized grains.

Therefore, since the present invention forms poly-Si having large-sized grains, not only is performance of a poly-Si TFT improved, but also quality of a liquid crystal display device equipped with the poly-Si TFT can be improved.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming a polycrystalline silicon film by crystallizing an amorphous silicon film, which is formed on a glass substrate by interposing a buffer layer therebetween, by irradiating a laser beam onto the amorphous silicon film using a predetermined mask, the method comprising the steps of:
   i) dividing an area of the predetermined mask into first, second, and third shot regions, a first shot region having a plurality of non-overlapping first transmission sections arranged in a first column along a y-direction, a second shot region having a plurality of non-overlapping second transmission sections arranged in a second column along the y-direction, a third shot region having a plurality of non-overlapping third transmission sections arranged in a third column along the y-direction.
      wherein the second column of second transmission sections is formed in between the first and third columns along the x-direction in a non-overlapping manner,
      wherein each second transmission section is positioned to correspond to a non-transmission section between two first transmission sections in the first column along the x-direction such that the width in the y-direction of each second transmission section in the second column is wider than the width in the y-direction of the corresponding non-transmission section in the first column, and
      wherein each third transmission section in the third column is positioned to correspond along the x-direction to one of first and second transmission sections in the first and second columns such that the width in the y-direction of the third transmission section is less than the width in the y-direction of the corresponding one of first and second transmission sections in the first and second columns; and
   ii) performing primary to $n^{th}$ laser irradiation processes with respect to the glass substrate by using the mask having a mask pattern while moving the glass substrate in a predetermined direction by a predetermined distance, thereby crystallizing the amorphous silicon film.

2. The method as claimed in claim 1, wherein spontaneous nucleation is created in the transmission sections of the first and second shot regions when a laser beam is irradiated onto the transmission sections of the first and second shot regions, and the amorphous silicon film is crystallized into the polycrystalline silicon film by means of a laser beam irradiated onto the amorphous silicon film through transmission sections of the third shot region.

3. The method as claimed in claim 2, wherein a thickness of the transmission sections of the third shot region is smaller than a thickness of the transmission sections of the first and second shot regions.

4. The method as claimed in claim 1, wherein the laser irradiation processes are carried out with energy sufficient for completely melting the amorphous silicon film or the polycrystalline silicon film.

5. The method as claimed in claim 1 or 4, wherein the laser irradiation processes are carried out by using a pulse duration extender in such a manner that pulse duration time is increased.

6. A mask pattern for forming a polycrystalline silicon layer by irradiating an amorphous silicon layer with a laser according to a sequential lateral solidification technique, the mask pattern comprising:
   a first shot region having a plurality of non-overlapping first transmission sections arranged in a first column along a y-direction;
   a second shot region having a plurality of non-overlapping second transmission sections arranged in a second column along the y-direction; and
   a third shot region having a plurality of non-overlapping third transmission sections arranged in a third column along the y-direction,
      wherein the second column of second transmission sections is formed in between the first and third columns along the x-direction in a non-overlapping manner,
      wherein each second transmission section is positioned to correspond to a non-transmission section between two first transmission sections in the first column along the x-direction such that the width in the y-direction of each second transmission section in the second column is wider than the width in the y-direction of the corresponding non-transmission section in the first column, and
      wherein each third transmission section in the third column is positioned to correspond along the x-direction to one of first and second transmission sections in the first and second columns such that the width in the y-direction of the third transmission section is less than the width in the y-direction of the corresponding one of first and second transmission sections in the first and second columns.

7. A method of forming a polycrystalline silicon film by crystallizing an amorphous silicon film by irradiating a laser beam onto the amorphous silicon film using a mask, the method comprising the step of:
   performing a plurality of laser irradiation processes on the amorphous silicon film by using the mask having a mask pattern while moving the amorphous silicon film in a predetermined direction by a predetermined distance, crystallizing the amorphous silicon film,
      wherein the laser irradiation processes are carried out by using a pulse duration extender in such a manner that pulse duration time is increased.

8. The mask pattern of claim 6, wherein the x-directional position of each third transmission section in the third column corresponds to the center of one of first and second transmission sections in the first and second columns.

* * * * *